(12) United States Patent
Jeong

(10) Patent No.: US 7,425,482 B2
(45) Date of Patent: Sep. 16, 2008

(54) NON-VOLATILE MEMORY DEVICE AND METHOD FOR FABRICATING THE SAME

(75) Inventor: Yong-Sik Jeong, Chungcheongbuk-do (KR)

(73) Assignee: Magna-Chip Semiconductor, Ltd. (KR)

( * ) Notice: Subject to any disclaimer, the term of this patent is extended or adjusted under 35 U.S.C. 154(b) by 200 days.

(21) Appl. No.: 11/250,052

(22) Filed: Oct. 12, 2005

(65) Prior Publication Data

US 2006/0118857 A1    Jun. 8, 2006

Related U.S. Application Data

(60) Provisional application No. 60/618,635, filed on Oct. 13, 2004.

(51) Int. Cl.
H01L 21/338 (2006.01)
H01L 21/8238 (2006.01)
H01L 21/336 (2006.01)

(52) U.S. Cl. ............... 438/167; 438/199; 438/201; 438/257; 438/581; 438/630; 438/649; 438/651; 438/682; 438/721; 438/755; 257/315; 257/316; 257/E21.209; 257/E21.422; 257/E21.613; 257/E21.659; 257/E21.685

(58) Field of Classification Search ............... 438/257, 438/201, 167, 199; 257/E21.209, E21.422, 257/E21.613, E21.659, E21.685, E21.687, 257/315, 316

See application file for complete search history.

(56) References Cited

U.S. PATENT DOCUMENTS

| | | | |
|---|---|---|---|
| 5,414,286 A | * | 5/1995 | Yamauchi .................. 257/315 |
| 6,451,652 B1 | * | 9/2002 | Caywood et al. ............ 438/257 |
| 2004/0151028 A1 | * | 8/2004 | Chih et al. ............. 365/185.23 |

* cited by examiner

Primary Examiner—Walter L. Lindsay, Jr.
Assistant Examiner—Mohsen Ahmadi
(74) Attorney, Agent, or Firm—Blakely, Sokoloff, Taylor & Zafman

(57) ABSTRACT

A non-volatile memory device and a method for fabricating the same are provided. The method includes: forming a plurality of gate structures on a substrate, each gate structure including a first electrode layer for a floating gate; forming a first insulation layer covering the gate structures and active regions located at each side of the gate structures; forming a second electrode layer over the first insulation layer; and forming a plurality of control gates on the active regions located at each side of the gate structures by performing an etch-back process to the second electrode layer.

23 Claims, 9 Drawing Sheets

NON-VOLATILE MEMORY DEVICE AND METHOD FOR FABRICATING THE SAME

This application relies for priority upon U.S. Provisional Patent Application No. 60/618,635 filed on Oct. 13, 2004, the contents of which are herein incorporated by reference in its entirety.

FIELD OF THE INVENTION

The present invention relates to a non-volatile memory device and a method for fabricating the same; and, more particularly, to a non-volatile memory device and a method for fabricating the same, wherein spacers for use in control gates can be easily formed through an etch-back process and a shadow event does not occur during an ion implantation process.

DESCRIPTION OF RELATED ARTS

Generally, non-volatile memory devices, especially, flash memory devices are classified into two cell types. One cell type is an electrically tunneling oxide (ETOX) and the other cell type is a split gate. The ETOX type is advantageous in respect of a cell size. The cell size of the ETOX type is smaller than that of the split gate type. However, during a programming operation, the ETOX type consumes lots of current because of an implantation of high thermal carriers and programming and reading errors occur frequently. Also, the ETOX type has a frequent occurrence of an over-erase event, which is crucially related to reliability.

Despite that the cell size of the split gate type is big, the split gate type is more widely used in semiconductor industries since the split gate type has excellent reliability. There is not a concern about the over-erase event when using the split gate type flash memories. Since a select transistor exists within a unit cell, a consistent level of a threshold voltage can be maintained. Hence, even if the cell transistor is depleted, an external device can sense the threshold voltage of the select transistor.

Various technologies have been developed and implemented to fabricate such advantageous split gate type flash memories. However, in those developed and currently implemented technologies of fabricating split gate type flash memories, a channel length of the select transistor is determined by a photolithography process. Thus, the channel length of the select transistor is dependent on the fact that how the photolithography equipment can precisely perform an alignment technology. Because of this dependency, the channel length of the select transistor often becomes inconsistent.

In an attempt to resolve the above disadvantage, a self-alignment method is employed to form select transistors. U.S. Pat. No. 6,451,652 issued to John Caywood et al., entitled "Method for Forming an EEPROM Cell Together With Transistor for Peripheral Circuit" introduces a fabrication method of a split gate flash memory device based on the self-alignment method.

FIG. 1 is a top view illustrating a layout of a unit cell of a conventional electrically erasable programmable read-only memory (EEPROM).

As illustrated, the unit cell of the conventional EEPROM includes a floating gate 222, which is electrically connected. The floating gate 222 is formed underneath a polysilicon layer 120 for a control gate.

FIGS. 2A to 2D are cross-sectional views of the conventional EEPROM of FIG. 1 for illustrating a method for fabricating the same. Particularly, the illustrated conventional EEPROM is cut in the direction of a line A-A' of FIG. 1. The same reference numerals used in FIG. 1 are used for the same elements described in the following drawings.

Referring to FIG. 2A, first insulation layers 206 and 208 are formed in a substrate 224. The first insulation layers 206 and 208 are device isolation layers obtained through a shallow trench isolation method. As the name indicates, the first insulation layers 206 and 208 isolate memory cells electrically. A silicon oxide layer 230 is formed thinly on a certain region of the substrate 224. A floating gate 222 is formed on the silicon oxide layer 230.

Referring to FIG. 2B, a photo-exposure process and a subsequent etching process are performed to complete the formation of the floating gate 222 and then, a third insulation layer including an upper insulation layer 230 and lower insulation layers 232 and 234 is formed over the floating gate 222. Gate oxide layers 202 and 204 are formed in a peripheral region. A conductive layer 240 is formed over the above resulting structure. The conductive layer 240 is based on a material to be used as an electrode. Metals and semiconductor materials are examples of such electrode material.

The silicon oxide layer 230 is a gate dielectric layer for the floating gate 222, and the upper insulation layer 232 and the lower insulation layers 234 and 236 are gate dielectric layers for a select transistor. The gate oxide layers 202 and 204 are gate dielectric layers for those transistors formed in the peripheral region.

Referring to FIG. 2C, a photoresist layer is formed over the conductive layer 240 and photo-exposed to form a first photoresist pattern 250 and a second photoresist pattern 252. The first photoresist pattern 250 is disposed such that each lateral edge of the first photoresist pattern 250 is placed between one outer edge of the upper insulation layer 232, which encompasses the floating gate 222, and one sidewall edge of the conductive layer 240. As simultaneous to the formation of the first photoresist pattern 250, the second photoresist pattern 252 for forming gates is formed in the peripheral region except for a cell region where memory array exists.

Referring to FIG. 2D, the conductive layer 240 is etched using the first photoresist pattern 250 and the second photoresist pattern 252 as an etch mask. The conductive layer 240 is etched in an amount that is higher than the addition of the thickness of the conductive layer 240 and a delta amount taking account of process parameter variations. After the etching process, in the cell region, spacers 260 and 262 are formed larger than the first photoresist pattern 250. The spacers 260 and 262 have the same size regardless of a change in the photo-exposure/etching process.

Another suggested method for forming a select transistor according to the self-alignment method is taught in U.S. Pat. No. 6,365,449 issued to Max C. Kuo et al., entitled "Process for Making Non-volatile Memory Cell with a Polysilicon Spacer Defined Select Gate." Particularly, this suggested method introduces fabrication of a split gate type flash memory device with a select transistor.

FIGS. 3A and 3B are cross-sectional views of another conventional split gate type flash memory device with a self-aligned select transistor for illustrating a fabrication method thereof.

Referring to FIG. 3A, a tunnel oxide layer 12 is formed on a substrate 22. The tunnel oxide layer 12 has a thickness of 85 Å although the typically formed thickness is in a range of 70 Å to 100 Å. Although not illustrated, a first polysilicon layer is formed thereon and is patterned using a photoresist layer, and as a result, a floating gate 14 is obtained. The floating gate 14 has a thickness t3 ranging from 1,000 Å to 3,000 Å. An inter-poly-dielectric (IPD) layer 16 is formed over the floating gate 14 and the substrate 22. The IPD layer 16 typically includes an oxide layer, a nitride layer and a combination thereof. A second polysilicon layer 18 is formed on the IPD layer 16. The second polysilicon layer 18 has a thickness ranging from 1,500 Å to 4,000 Å. A preferable thickness of the second polysilicon layer 18 is 2,500 Å. Reference denotations 11 and t2 represent thicknesses of certain portions of the second polysilicon layer 18. A photoresist layer is formed over the second polysilicon layer 18 and photo-exposed to form a photoresist pattern 20. The edges of the photoresist pattern 20 are disposed in the inward directions X and Y from the sidewalls of the second polysilicon layer 18.

Referring to FIG. 3B, the second polysilicon layer 18 is etched using the photoresist pattern 20 as an etch mask. An etching amount of the second polysilicon layer 18 is determined based on the addition of the thickness of the second polysilicon layer 18 and an over-etching amount caused by a process margin. Through this etching process, a control gate is formed in a manner to encompass the floating gate 14 and the IPD layer 16.

Sidewalls of the control gate act as a gate of a select transistor. A plurality of the select transistors are formed with the identical size, and in addition to the illustrated region in FIG. 3B, the select transistors are formed in the identical sizes in other regions as well.

However, the above described conventional flash memory devices have disadvantages. With reference to FIG. 4, detailed description of the disadvantages will be provided hereinafter.

As illustrated in FIG. 4, when a conductive layer 462 is etched, a poly-slope or a poly-peak is formed due to polymers, which are generated by photoresist patterns 450 and an etchant used in the etching process. The above poly-slope or poly-peak generation may become a cause of inducing a salicide-stimulated electric short between a control gate (i.e., the patterned portions of the conductive layer 462) and a silicon substrate 424 during a subsequent salicide process. Thus, salicide is not formed intentionally in the cell region. However, there may be other disadvantages of increasing resistance caused by a decrease in the contact hole size and increasing resistance of the control gate. Also, the poly-peak may act as a foreign material, which may further induce product defects.

When gates of flash memory devices are formed in a stack type, heights of cells are also increased. Thus, it is difficult to perform an ion implantation process with an intended angle to form cell junction regions. Also, as depths of bit line contacts and other contacts in the peripheral region get deeper, it is much difficult to implement relevant fabrication processes, thereby diminishing device yields.

When the control gate is doped, a shadow effect appears during the ion implantation process due to the photoresist pattern. Thus, it may be difficult to dope the gates of the select transistors.

Although the gates of the select transistors can be formed by the self-alignment method as illustrated in FIGS. 3A and 3B, the gate sizes of the select transistors may vary when a misalignment event occurs or a critical dimension is changed due to variations in process parameters or equipment conditions. The gate size variation gets severe as the thickness of the second polysilicon layer 18 is decreased. In consideration of a current trend that the second polysilicon layer 18 gets thinner as semiconductor devices are micronized, it may be difficult to fabricate micronized and integrated devices based on the aforementioned conventional methods.

SUMMARY OF THE INVENTION

It is, therefore, an object of the present invention to provide a method for fabricating a non-volatile memory device, wherein spacers of a control gate can be easily formed through an etch-back process instead of a photo-exposure/etching process and a shadow effect does not occur during an ion implantation process for doping the control gate.

It is another object of the present invention to provide a method for fabricating a non-volatile memory device, wherein a salicide formation can be implemented over the entire chip region, so that the chip area can be reduced by a decrease in word line resistance and contact resistance and thus, cost competitive and stabilized device yields can be achieved.

It is still another object of the present invention to provide a method for fabricating a non-volatile memory device, which can be self-aligned even if devices are micronized and thicknesses of gate electrodes are decreased.

It is a further object of the present invention to provide a method for fabricating a non-volatile memory device, wherein a height of a cell is decreased as a control gate does not exist on a floating gate and thus, a contact hole can be formed more easily, thereby improving device yields.

It is an even further object of the present invention to provide a method for fabricating a non-volatile memory device, wherein a height of a floating gate can be freely adjustable to increase the coupling ratio.

In accordance with an aspect of the present invention, there is provided a method for fabricating a non-volatile memory device, including: forming a plurality of gate structures on a substrate, each gate structure including a first electrode layer for a floating gate; forming a first insulation layer covering the gate structures and active regions located at each side of the gate structures; forming a second electrode layer over the first insulation layer; and forming a plurality of control gates on the active regions located at each side of the gate structures by performing an etch-back process to the second electrode layer.

In accordance with another aspect of the present invention, there is provided a method for fabricating a non-volatile memory device, including: forming a plurality of first gate structures on a first region of a substrate, wherein each gate structure including a first electrode layer for a floating gate;

forming a first insulation layer on the first gate structures and active regions located at each side of the first gate structure, and a second region of the substrate;

forming a second electrode layer over the fourth insulation layer; and forming a plurality of control gates on the active regions located at each side of the first gate structures by performing an etch-back process to the second electrode layer, and simultaneously forming a plurality of second gate structures on the second region of the substrate using a photoresist pattern as an etch mask.

In accordance with still another aspect of the present invention, there is provided a non-volatile memory device, including: a plurality of gate structures arranged with a predetermined distance, each gate structure including a first insulation layer, a first electrode layer for a floating gate and a second insulation layer; a plurality of second electrode layers for control gates formed to encompass sidewalls of the individual gate structures; and a plurality of third insulation layers encompassing the respective gate structures such that the individual second electrode layers are apart from the individual gate structures with a predetermined distance.

In accordance with further aspect of the present invention, there is provided a non-volatile memory device, including: a first gate structure for storing data, the first gate structure including a first insulation layer, a first electrode layer for a floating gate and a second insulation layer; a third insulation layer formed on the first gate structure covering regions adjacent to a predetermined region contacting the fist gate structure; and a second electrode layer for a control gate formed on sidewalls of the third insulation layer.

BRIEF DESCRIPTION OF THE DRAWINGS

The above and other objects and features of the present invention will become better understood with respect to the following description of the preferred embodiments given in conjunction with the accompanying drawings, in which.

DETAILED DESCRIPTION OF THE INVENTION

A non-volatile memory device and a method for fabricating the same in accordance with specific embodiments of the present invention will be described in detail with reference to the accompanying drawings, which is set forth hereinafter.

Figure 5:
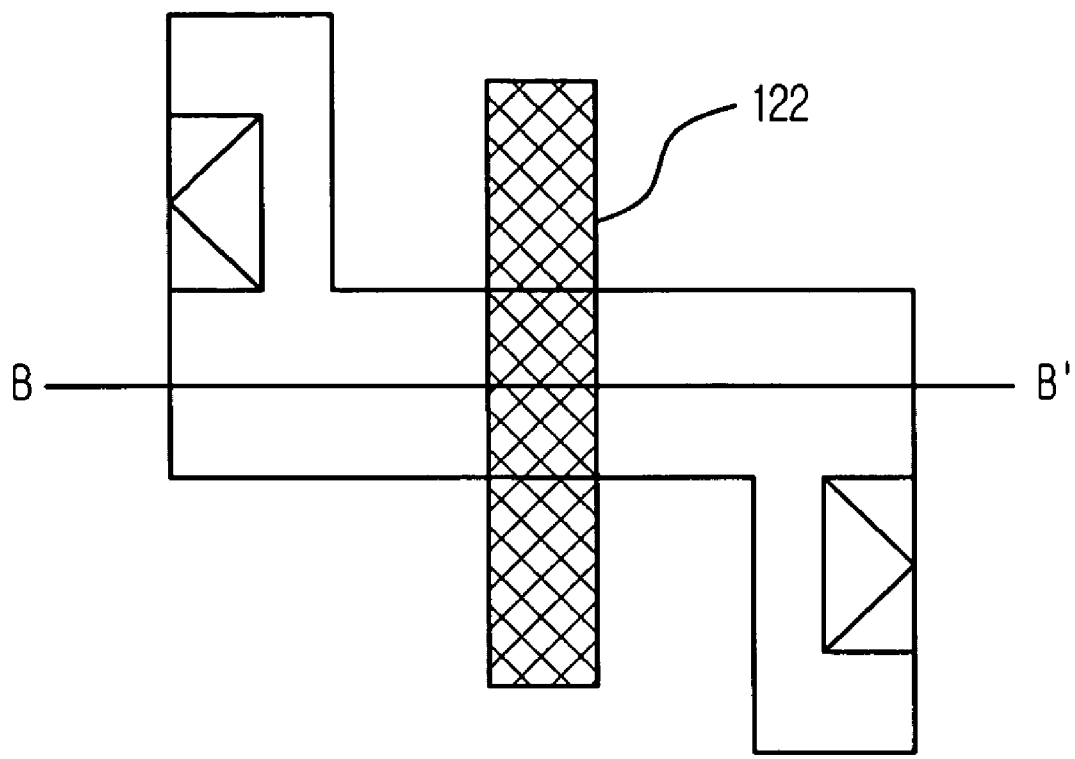
FIG. 5 is a top view showing a unit cell layout of a non-volatile memory device in accordance with a specific embodiment of the present invention.

FIG. 5 is a top view illustrating a unit memory cell of a non-volatile memory device in accordance with a specific embodiment of the present invention.

Figure 1:
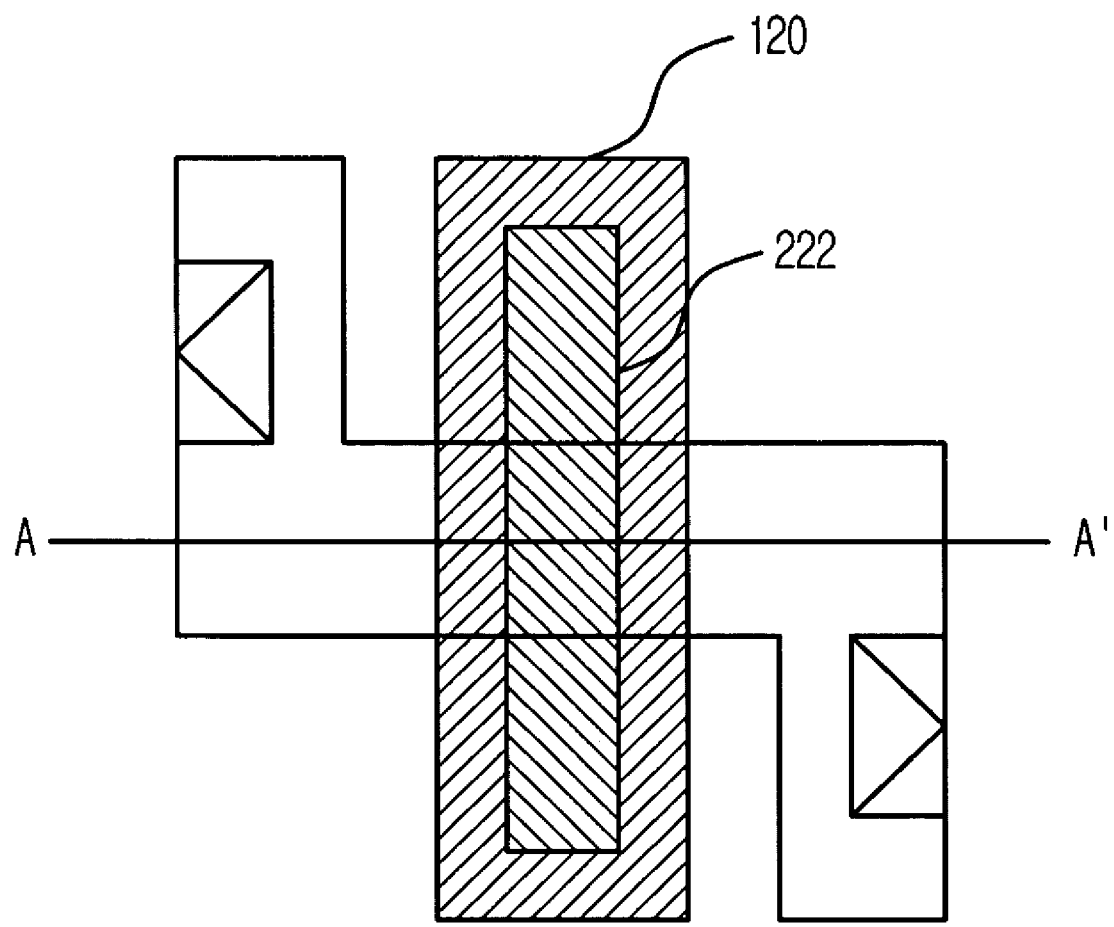
FIG. 1 is a top view showing a unit cell layout of a conventional electrically erasable programmable read-only memory (EEPROM)
Figure 2A:
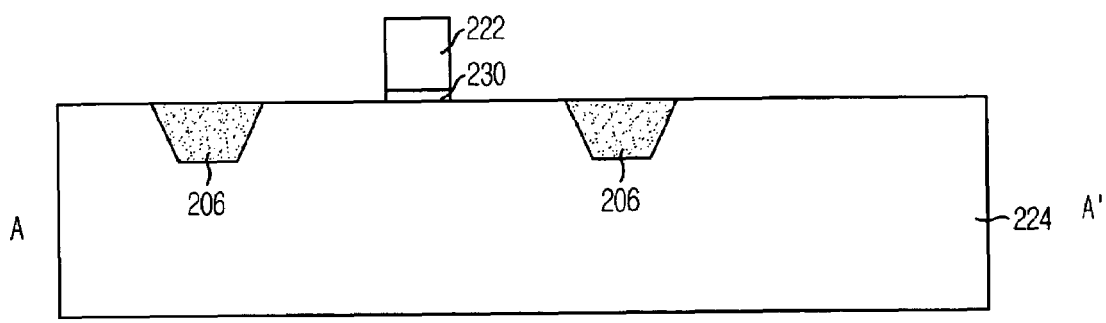
FIGS. 2A to 2D are cross-sectional views illustrating a method for fabricating the conventional EEPROM cut in the direction of a line A-A' shown in FIG. 1.
Figure 2B:
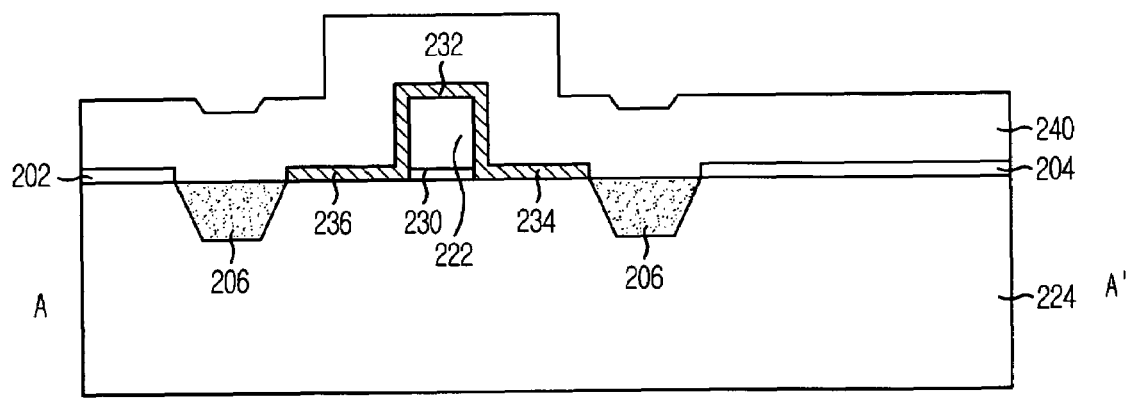
Figure 2C:
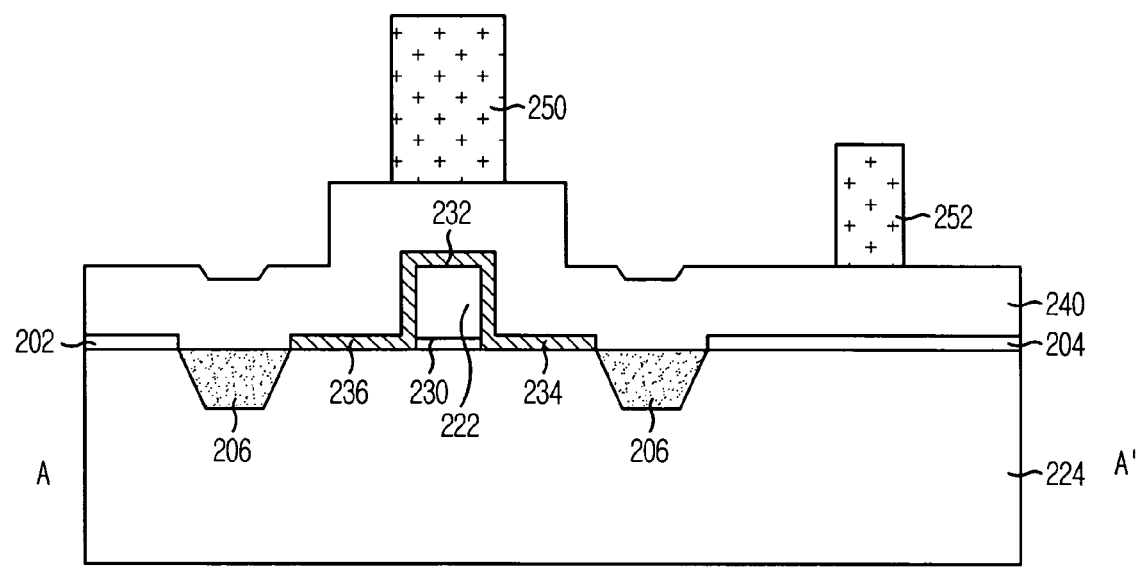
Figure 2D:
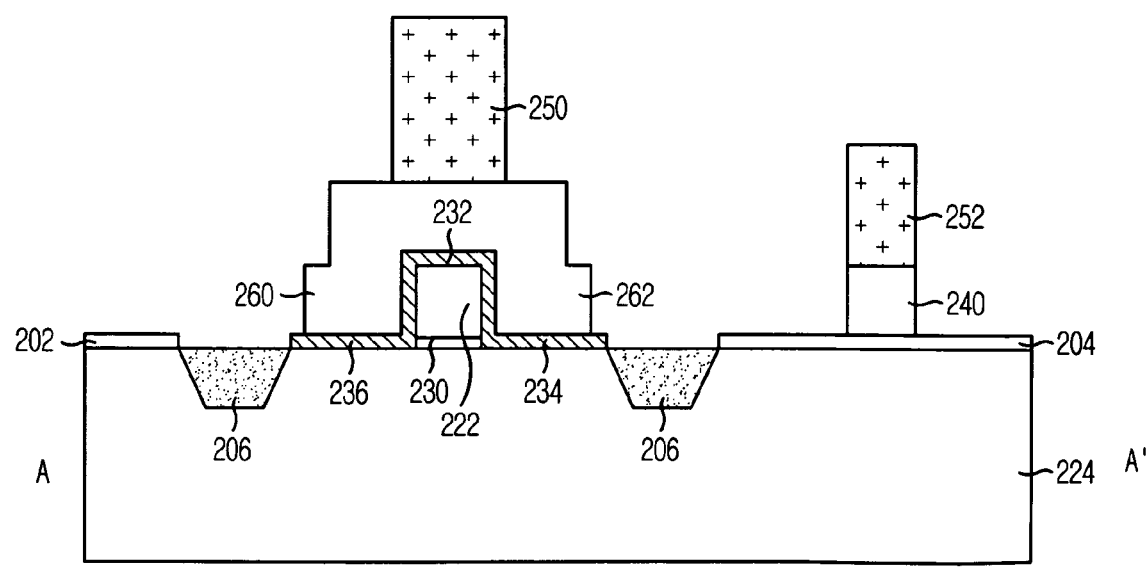
Figure 3A:
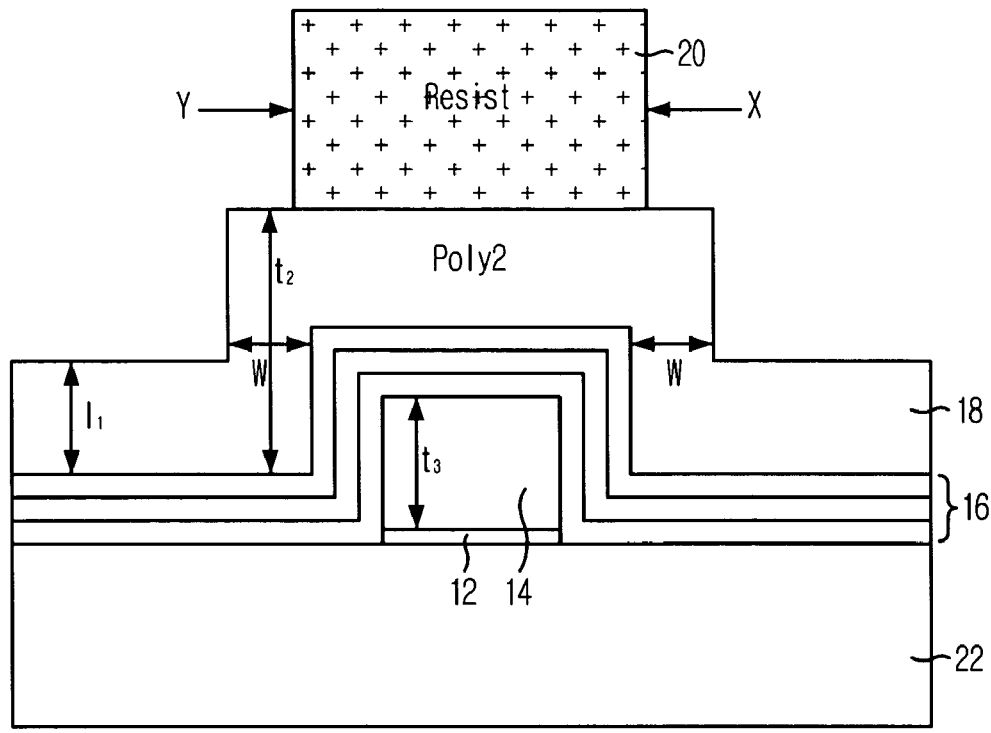
FIGS. 3A and 3B are cross-sectional views of a conventional split gate type flash memory device with a self-aligned select transistor.
Figure 3B:
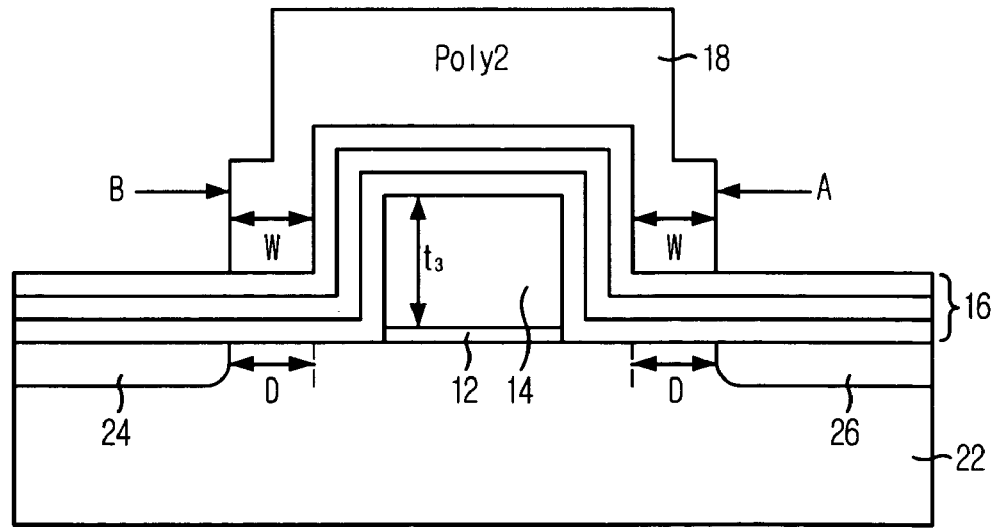
Figure 4:
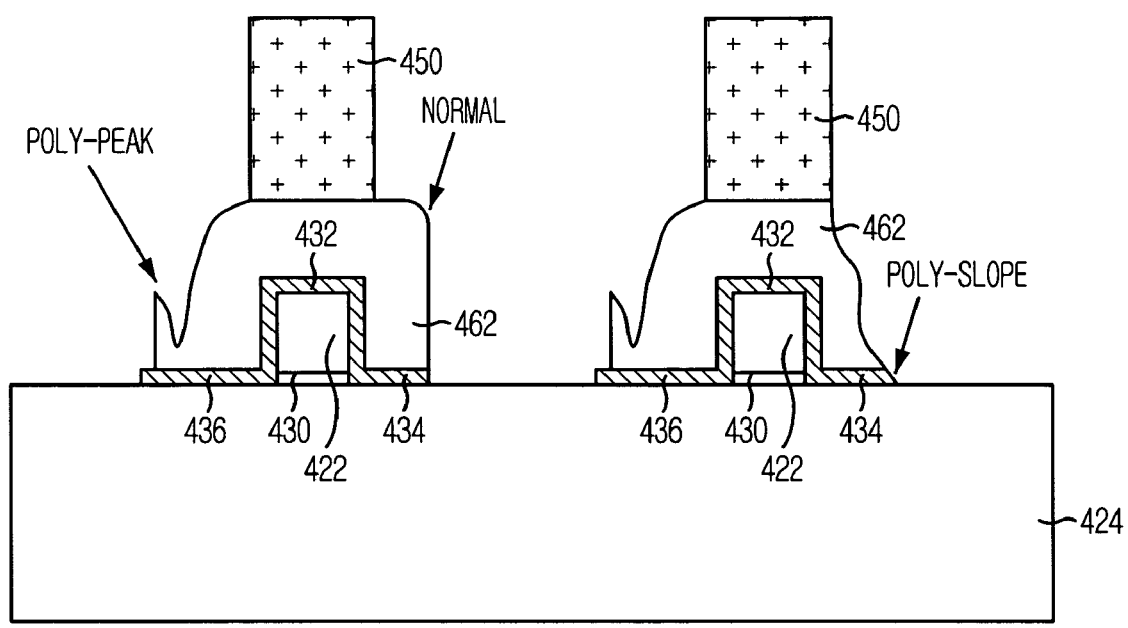
FIG. 4 is a diagram depicting disadvantages of using various types of conventional non-volatile memory devices.

Being different from the unit memory cell of the conventional memory cell layout illustrated in FIG. 1, the unit memory cell layout of the non-volatile memory device includes a floating gate 122 without including a polysilicon layer typically used to form a control gate over the floating gate 122.

FIGS. 6A to 6D are cross-sectional views of the non-volatile memory device cut in the direction of a line B-B' of FIG. 5 for illustrating a method for fabricating the same.

Figure 6A:
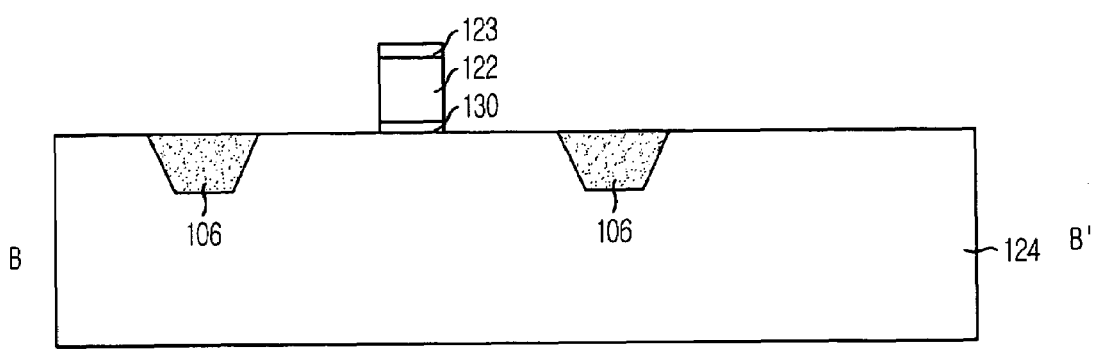
FIGS. 6A to 6D are cross-sectional views of the non-volatile memory device cut in the direction of a line B-B' of FIG. 5 for illustrating a method for fabricating the same.

Referring to FIG. 6A, trenches are formed in predetermined regions of a substrate 124 by employing a shallow trench isolation (STI) method and, first insulation layers 106 and 108 are filled into the trenches to isolate memory cells electrically.

A tunneling oxide layer 130 is formed thinly on the substrate 124, and a floating gate 122 is formed as an electrode on the tunneling oxide layer 130. The tunneling oxide layer 130 has a preferable thickness ranging from approximately 70 Å to approximately 100 Å. Afterwards, a second insulation layer 123 is formed on the floating gate 122. The second insulation layer 123 is used to form a hard mask.

According to the specific embodiment of the present invention, the floating gate 122 has a thickness ranging from approximately 1,000 Å to approximately 5,000 Å. This thickness of the floating gate 122 should be determined carefully since the thickness is an important factor for determining the coupling ratio of the floating gate 122.

Also, the second insulation layer 123 can be one selected from a group consisting of oxide, nitride and a combination thereof. A thickness of the second insulation layer 123 is determined by the thickness of the floating gate 122 and, the thickness of the second insulation layer 123 is in a range of approximately 500 Å to approximately 2,000 Å. The formation of the floating gate 122 is achieved via a photo-exposure process and an etching process.

Figure 6B:
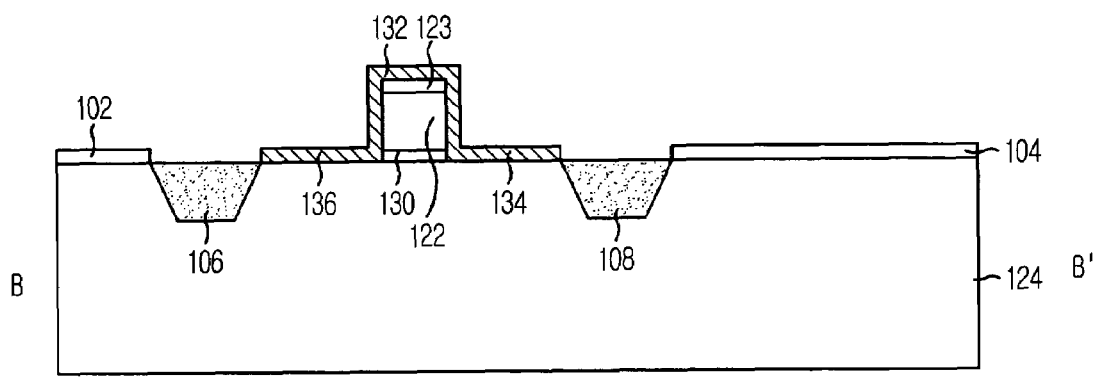

Referring to FIG. 6B, after the formation of the floating gate 122, a third insulation layer including an upper insulation layer 132 and lower insulation layers 134 and 136 are formed over the second insulation layer 123 encompassing sidewalls of the floating gate 122. As shown in FIG. 6B, the third insulation layer covers a gate structures including the floating gate 122 and active regions located at each side of the gate structures. The upper insulation layer 132 and the lower insulation layers 134 and 136 can be formed of a material selected from a group consisting of oxide, nitride and a combination thereof. In a peripheral region, gate insulation layers 102 and 104 are formed on the substrate 124. The thickness of the gate insulation layers 102 and 104 are determined by usage of the circuits and devices. In the case that the gate insulation layers 102 and 104 have a different thickness, a complex gate insulation process is implemented to form the gate insulation layers 102 and 104 with different thicknesses.

A conductive layer 140 is formed over the above resulting structure. The conductive layer 140 is an electrode material selected from a group consisting of polysilicon, amorphous silicon (Si), tungsten (W), tungsten salicide ($WSi_x$), and titanium (Ti).

Figure 6C:
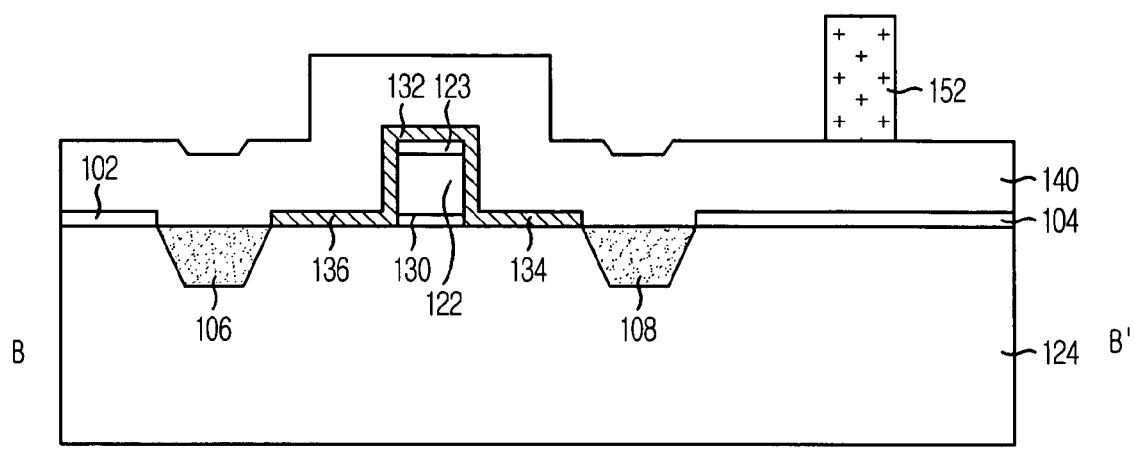

Referring to FIG. 6C, a photoresist layer is formed over the conductive layer 140 and photo-exposed to obtain a photoresist pattern 152. As illustrated in FIG. 6C, the photoresist pattern 152 is not formed in the cell region but in the peripheral region to form a gate for use in a peripheral circuit. One distinctive feature of the specific embodiment of the present invention is that a control gate can be formed in the cell region without using the photoresist pattern.

Figure 6D:
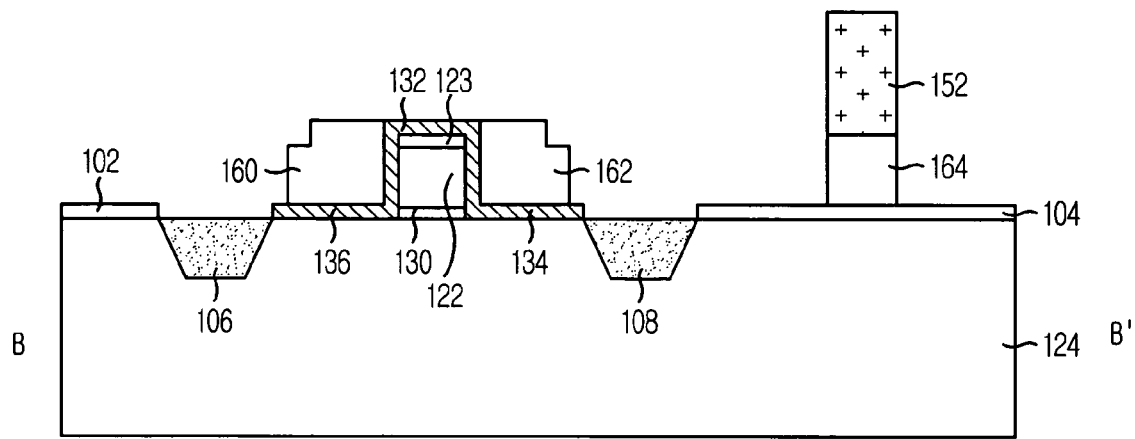

Referring to FIG. 6D, the conductive layer 140 is etched using the photoresist pattern 152 as an etch mask. The etching amount of the conductive layer 140 is determined based on the addition of the thickness of the conductive layer 140 and a delta amount taking account of potential variations in related processes.

After the above etching process, spacers 160 and 162 are formed on the active regions located at each side of the gate structures in the cell region by performing an etch-back process to the conductive layer 140. The spacers 160 the aforementioned control gate. Sizes of the spacers 160 and 162 are the same because of the etch-back process instead of the conventionally employed photo-exposure process and the etching process, which result in a poly-peak or poly-slope generation. A gate electrode 164 is simultaneously formed in the peripheral region.

Figure 7:
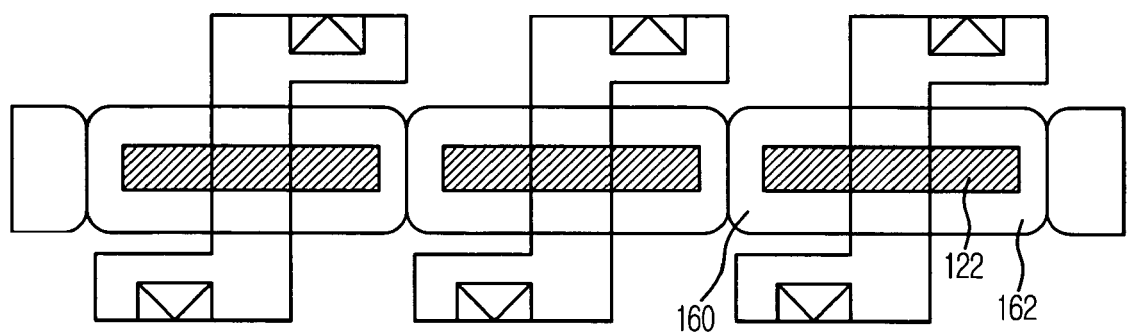
FIG. 7 is a top view showing a layout of a non-volatile memory device obtained after a gate etching process in accordance with the specific embodiment of the present invention.

FIG. 7 is a top view showing a non-volatile memory device obtained after the above etching process for forming the control gate (i.e., the spacers 160 and 162) and the gate electrode 164 in accordance with the specific embodiment of the present invention. Herein, the same reference numerals are used for the same elements described in FIGS. 6A to 6D.

As shown, the floating gates 122 are isolated by the first insulation layers (not shown). Also, the control gates are formed in the form of sidewall spacers 160 and 162. The spacers 160 and 162 are not disconnected but connected as word lines through being appropriately arranged at a first terminal and a node connected with a bias circuit.

In accordance with the specific embodiment of the present invention, the control gate in the cell region is formed by the etch-back process instead of the conventional photo-exposure process and the etching process. Thus, spacers for use in the control gate can be easily formed and a shadow effect does not appear during an ion implantation process.

Also, the implementation of the etch-back process gives a normal shape of the spacers (i.e., no poly-peak or poly-slope event). Thus, there is no occurrence of an over-bridge event caused by silicide. As a result of this effect, silicide can be applied over the entire chip area, thereby reducing word line resistance and contact resistance. The decrease in the word line resistance and contact resistance contribute to a smaller chip area. Accordingly, more cost-competitive and stabilized device yields can be achieved.

Since the control gate does not exist over the floating gate, a height of a memory cell is decreased, thereby further decreasing a height of a contact hole. The decrease in the height of the contact hole can prevent various defect generations.

While the present invention has been described with respect to certain preferred embodiments, it will be apparent to those skilled in the art that various changes and modifications may be made without departing from the spirit and scope of the invention as defined in the following claims.

What is claimed is:

1. A method for fabricating a non-volatile memory device, comprising:
    forming a plurality of gate structures on a substrate, each gate structure including a first electrode layer for a floating gate;
    forming a first insulation layer covering the gate structures and active regions located at each side of the gate structures;
    forming a second electrode layer over the first insulation layer;
    forming a plurality of control gates on the active regions located at each side of the gate structures by performing an etch-back process to the second electrode layer; and
    performing a silicide process in a cell area including a plurality of control gates on the active regions located at each side of the gate structures.

2. The method of claim 1, wherein each control gate is formed to encompass each side of each gate structure.

3. The method of claim 2, wherein the control gates are connected to each other.

4. The method of claim 3, wherein each control gate is used to connect word lines in the unit of one byte or a predetermined number of bytes.

5. The method of claim 1, wherein the first insulation layer includes a material selected from a group consisting of oxide, nitride and a combination thereof.

6. The method of claim 1, wherein the first electrode layer and the second electrode layer include a material selected from a group consisting of polysilicon, amorphous silicon, tungsten, tungsten silicide, and titanium.

7. The method of claim 1, wherein each gate structure includes a second insulation layer and a third insulation layer, and the first electrode layer is formed between the second and third insulation layers.

8. The method of claim 7, wherein the second insulation layer has a thickness ranging from approximately 70 Å to approximately 700 Å.

9. The method of claim 7, wherein the first electrode layer has a thickness ranging from approximately 1,000 Å to approximately 5,000 Å.

10. The method of claim 7, wherein the third insulation layer includes a material selected from a group consisting of oxide, nitride and a combination thereof.

11. The method of claim 10, wherein the third insulation layer has a thickness ranging from approximately 500 Å to approximately 2,000 Å.

12. A method for fabricating a non-volatile memory device, comprising:
    forming a plurality of first gate structures on a first region of a substrate, wherein each gate structure includes a first electrode layer for a floating gate;
    forming a first insulation layer on the first gate structures and active regions located at each side of the first gate structure, and a second region of the substrate;
    forming a second electrode layer over the first insulation layer;
    forming a plurality of control gates on the active regions located at each side of the first gate structures by performing an etch-back process to the second electrode layer, and simultaneously forming a plurality of second gate structures on the second region of the substrate using a photoresist pattern as an etch mask; and
    forming a silicide process in a cell area including a plurality of control gates on the active regions located at each side of the gate structures.

13. The method of claim 12, wherein the first insulation layer and the fourth insulation layer include a material selected from a group consisting of oxide, nitride and combination thereof.

14. The method of claim 12, wherein the first electrode layer and the second electrode layer include a material selected from a group consisting of polysilicon, amorphous silicon, tungsten, tungsten silicide, and titanium.

15. The method of claim 12, wherein the first gate structures are used for storing data and the second gate structures are used for a peripheral circuit.

16. The method of claim 12, wherein the forming of the second gate structure includes:
    forming the photoresist pattern on a predetermined portion of the second electrode layer on the second region of the substrate; and
    patterning the second electrode layer using the photoresist pattern as the etch mask to form the second gate structures on the second region of the substrate.

17. The method of claim 12, wherein the control gates are connected to each other.

18. The method of claim 17, wherein each control gate is used to connect word lines in the unit of one byte or a predetermined number of bytes.

19. The method of claim 12, wherein each first gate structure includes a second insulation layer and a third insulation layer, and the first electrode layer is formed between the second and third insulation layers.

20. The method of claim 19, wherein the second insulation layer has a thickness ranging from approximately 70 Å to approximately 100 Å.

21. The method of claim 19, wherein the first electrode layer has a thickness ranging from approximately 1,000 Å to approximately 5,000 Å.

22. The method of claim 19, wherein the third insulation layer includes a material selected from a group consisting of oxide, nitride and a combination thereof.

23. The method of claim 22, wherein the third insulation layer has a thickness ranging from approximately 500 Å to approximately 2,000 Å.

* * * * *

UNITED STATES PATENT AND TRADEMARK OFFICE
CERTIFICATE OF CORRECTION

PATENT NO. : 7,425,482 B2 Page 1 of 1
APPLICATION NO. : 11/250052
DATED : September 16, 2008
INVENTOR(S) : Jeong It is certified that error appears in the above-identified patent and that said Letters Patent is hereby corrected as shown below:

On the Title Page,
In Item [73], please delete "Magna-Chip" and insert -- Magnachip --.

Signed and Sealed this

Fourteenth Day of April, 2009

JOHN DOLL
*Acting Director of the United States Patent and Trademark Office*